United States Patent

Nam

[11] Patent Number: 5,982,306
[45] Date of Patent: Nov. 9, 1999

[54] VARIABLE-LENGTH CODING METHOD AND APPARATUS THEREOF

[75] Inventor: Seung-Hyun Nam, Kyunggi-Do, Rep. of Korea

[73] Assignee: Daewoo Electronics Co., Ltd., Seoul, Rep. of Korea

[21] Appl. No.: 08/982,372

[22] Filed: Dec. 2, 1997

[51] Int. Cl.⁶ .................................................. H03M 7/40
[52] U.S. Cl. ............................................... 341/67; 341/79
[58] Field of Search ................................ 341/60, 63, 65, 341/67, 79

[56] References Cited

U.S. PATENT DOCUMENTS

| | | |
|---|---|---|
| 3,675,212 | 7/1972 | Raviv et al. . |
| 3,918,047 | 11/1975 | Denes . |
| 4,574,382 | 3/1986 | Ko . |
| 4,853,696 | 8/1989 | Mukherjee ................................ 341/65 |
| 5,021,782 | 6/1991 | Perron et al. ............................ 341/67 |
| 5,216,423 | 6/1993 | Mukherjee ................................ 341/79 |
| 5,696,507 | 12/1997 | Nam . |
| 5,883,589 | 3/1999 | Takashima et al. ..................... 341/67 |

FOREIGN PATENT DOCUMENTS

| | | |
|---|---|---|
| 7-030434 | 1/1995 | Japan . |
| 10013247 | 1/1998 | Japan . |

OTHER PUBLICATIONS

WPI Accession No. 98–137037/199813, Dialog(R) File 351:Derwent WPI.

Primary Examiner—Howard L. Williams
Attorney, Agent, or Firm—Smith, Gambrell & Russell, LLP; Beveridge, DeGrandi, Weilacher & Young

[57] ABSTRACT

A method for translating symbols into variable-length code words is disclosed. The method includes the steps of a) generating a memorized code word from a code-book memory by inputting a symbol to the code-book memory in which the variable-length code words are stored; b) detecting a length of a variable-length code word included in the memorized code word on the basis of selected code words, levels defined in a Huffman code tree by each of the selected code words, and numbers of terminal nodes in each of the levels, wherein the selected code words are generated by selecting m bit among the memorized code word K times, where m=1, 2, 3, 4, . . . , K, and K denotes a maximum length of the variable length code word; and c) accessing the variable-length code word from the memorized code word according to the length of the variable-length code word. Therefore, the method makes it possible to translate the symbols into the variable-length code words without storing the length data in a memory.

22 Claims, 8 Drawing Sheets

FIG. 7

| t | X(t) | M(x) | LEG(x) | B(t)₁ | W₁ | L₁ L₂ | B(t)₂ | W₂ | C |
|---|---|---|---|---|---|---|---|---|---|
| 1 | | x x x x x x | 0 | x x x x x x x x : x x x x x x x x | x x x x x x x x | 0 0 | x x x x x x x x : x x x x x x x x | x x x x | 0 |
| 2 | a | $a_1$ x x x x x | 1 | x x x x x x x x : $a_1$ x x x x x x x | x x x x x x x $a_1$ | 0 6 | x x x x x x x x : $a_1$ x x x x x x x | x x x x | 0 |
| 3 | b | $b_1 b_2 b_3$ x x x | 3 | x x x x x x $a_1$ : $b_1 b_2 b_3$ x x x x x | x x x x x $a_1 b_1 b_2 b_3$ | 1 5 | x x x x x x $a_1$ : $b_1 b_2 b_3$ x x x x x | $a_1 b_1 b_2 b_3$ x x x | 0 |
| 4 | c | $c_1 c_2 c_3$ x x x | 3 | x x $a_1 b_1 b_2 b_3$ : $c_1 c_2 c_3$ x x x x x | $b_1 b_2 b_3 c_1 c_2 c_3$ x x | 4 2 | x x $a_1 b_1 b_2 b_3$ : $c_1 c_2 c_3$ x x x x x | $a_1 b_2 b_3 c_1 c_2 c_3$ 1 | 1 |
| 5 | f | $f_1 f_2 f_3 f_4 f_5$ x | 5 | $b_1 b_2 b_3 c_1 c_2 c_3 f_1 f_2 f_3 f_4 f_5$ x | $c_3 f_1 f_2 f_3 f_4 f_5$ x | 1 5 | $b_1 b_2 b_3 c_1 c_2 c_3 f_1 f_2 f_3 f_4 f_5$ x | $c_3 f_1 f_2 f_3 f_4 f_5$ x | 1 |
| 6 | d | $d_1 d_2 d_3$ x x x | 3 | $c_3 f_1 f_2 f_3 f_4 f_5$ : $d_1 d_2 d_3$ x x x | $f_3 f_4 f_5 d_1 d_2 d_3$ x x | 0 6 | $c_3 f_1 f_2 f_3 f_4 f_5$ : $d_1 d_2 d_3$ x x x | $d_1 d_2 d_3$ x x x | 0 |
| 7 | h | $h_1 h_2 h_3 h_4 h_5 h_6$ | 6 | $f_3 f_4 f_5 d_1 d_2 d_3$ : $h_1 h_2 h_3 h_4 h_5 h_6$ | $h_1 h_2 h_3 h_4 h_5 h_6$ | 3 3 | $f_3 f_4 f_5 d_1 d_2 d_3$ : $h_1 h_2 h_3 h_4 h_5 h_6$ | $d_1 d_2 d_3 h_1 h_2 h_3$ | 1 |
| 8 | e | $e_1 e_2 e_3 e_4$ x x | 4 | $h_1 h_2 h_3 h_4 h_5 h_6 e_1 e_2 e_3 e_4$ x x | $h_5 h_6 e_1 e_2 e_3 e_4$ | 3 3 | $h_1 h_2 h_3 h_4 h_5 h_6 e_1 e_2 e_3 e_4$ x x | $h_4 h_5 h_6 e_1 e_2 e_3$ | 1 |
| 9 | g | $g_1 g_2 g_3 g_4 g_5 g_6$ | 6 | $h_5 h_6 e_1 e_2 e_3 e_4 g_1 g_2 g_3 g_4 g_5 g_6$ | $g_1 g_2 g_3 g_4 g_5 g_6$ | 1 5 | $h_5 h_6 e_1 e_2 e_3 e_4 g_1 g_2 g_3 g_4 g_5 g_6$ | $e_4 g_1 g_2 g_3 g_4 g_5$ | 1 |
| 10 | a | $a_1$ x x x x x | 1 | $g_1 g_2 g_3 g_4 g_5 g_6 a_1$ x x x x x | $g_2 g_3 g_4 g_5 g_6 a_1$ | 1 5 | $g_1 g_2 g_3 g_4 g_5 g_6 a_1$ x x x x x | $g_6 a_1$ x x x | 0 |
| 11 | b | $b_1 b_2 b_3$ x x x | 3 | $g_2 g_3 g_4 g_5 g_6 a_1 b_1 b_2 b_3$ x x x | $g_5 g_6 a_1 b_1 b_2 b_3$ | 2 4 | $g_2 g_3 g_4 g_5 g_6 a_1 b_1 b_2 b_3$ x x x | $g_6 a_1 b_1 b_2 b_3$ x | 0 |

(X: don't care)

VARIABLE-LENGTH CODING METHOD AND APPARATUS THEREOF

BACKGROUND OF THE INVENTION

1. Field of the Invention

This invention relates to a variable-length coding method and an apparatus thereof. More particularly, the present invention relates to a method for transforming fixed length code words into variable-length code words on the basis of Huffman code tree and an apparatus which can perform the method.

2. Description of the Prior Art

Generally, a variable-length coding method is a coding technique often used for compressing data without loss of data. The variable-length coding transforms all occurring possible data, which are generated from a data source and are represented into fixed-length code words, into variable-length code words according to occurring probability of the data, such that an average code length of the data is reduced. That is, by assigning variable-length code words to the library of all occurring possible cod words, the average word length of the variable-length code is shorter than that of the original data, and therefore, data compression is achieved.

Huffman coding method is a procedure commonly used to construct a minimum redundant variable-length code for a known data statistic. Huffman coding method applies data of which statistics have already been known to Huffman code tree according to the statistic, and therefore the variable-length codes according to Huffman coding method are prefix-free variable length codes.

One example of a variable-length coding apparatus is disclosed in U.S. Pat. No. 3,675,212 issued to Josef Raviv, etc. on Jul. 4, 1972. The variable-length coding apparatus suggested by Josef Raviv, etc. includes a three-state associative memory which is employed as an encoding-decoding instrumentality for making conversions between fixed-length codes and variable-length codes. The three-state associative memory stores lengths of the variable-length code words associated with the fixed-length codes and variable-length codes.

Furthermore, the present inventor and assignee filed a decoding apparatus dated May 31, 1996, under the application Ser. No. 08/655,838, which is now issued.

SUMMARY OF THE INVENTION

It is one object of the present invention to provide a method which can transform fixed length code words into variable-length code words without memorizing the length information of variable-length code words.

It is other object of the present invention to provide an apparatus which can transform fixed-length code words into variable-length code words without memorizing the length information of variable-length code words.

In order to achieve the above objects, a method for translating symbols into variable-length code words according to the one aspect of the present invention includes the steps of: a) generating a memorized code word from a code-book memory by inputting a symbol to the code-book memory in which the variable-length code words are stored according to the symbols; b) detecting a length of a variable-length code word which is included in the memorized code word on the basis of selected code words, levels defined in a Huffman code free by each of the selected code words, the numbers of terminal nodes in each of the levels, wherein the selected code words are generated by selecting m bit among bits of the memorized code word K times, where m=1, 2, 3, 4, . . . , K, and K denotes a maximum length of the variable length code word; and c) accessing the variable-length code word from the memorized code word according to the length of the variable-length code word.

According to another aspect of the present invention, a method for coding symbols into variable-length code words includes the steps of: a) generating a memorized code word from a code-book memory by inputting a symbol to the code-book memory in which the variable-length code words are stored; b) selecting m bit among bits of the memorized code word in order to generate selected code words, where m=1, 2, 3, 4, . . . , K, and K denotes a maximum length of the variable length code word; c) determining whether each of the selected code words consists of bits of a variable length code word on the basis of each level which is defined in Huffman code tree according to each selected code word, and numbers of terminal nodes in each level; and d) accessing the variable-length code word from the memorized code word according to a result of the step c). Preferably, the step c) includes the steps of: c-1) detecting the levels of each of the selected code words on the basis of the Huffman code tree; c-2) detecting the numbers of terminal nodes in each level; and c-3) operating a function $LD(X)_m$, $$LD(X)_m = BW(X)_m - NW(X)_m$$

$$BW(X)_m = \sum_{i=1}^{m} 2^{m-i} \cdot b_i$$

$$NW(X)_m = \sum_{j=0}^{m-1} 2^{m-j} \cdot L_j$$

wherein $b_i$ is the i-th bit value of a selected code word selected m bits in the memorized code word, $L_j$ is a total number of terminal nodes in the j-th level of the Huffman code tree; and c-4) determining whether each $LD(X)_m$ is a negative value or not.

According to other aspect of the present invention, an apparatus for translating symbols into variable-length code words includes: a) code-book memory means for storing variable-length code words with a maximum length of the variable-length code words according to the symbols b) variable-length detection means for detecting a length of a variable-length code word included in the memorized code word on the basis of selected code words, levels defined in a Huffman code tree by each of the selected code words, and numbers of terminal nodes in each of the levels, wherein the selected code words are generated by selecting m bit among the memorized code word K times, where m=1, 2 3, 4, . . . , K, and K is a maximum length of the variable length code word; and c) packing means for accessing the variable-length code word from the memorized code word according to the length of the variable-length code word.

According to the present invention, the method and the apparatus make it possible to translate the symbols into the lengths of the variable-length code words without storing the length information for the variable-length code words in a memory, such that it is not need a memory for storing the length information for the variable-length code words.

BRIEF DESCRIPTION OF THE DRAWINGS

The foregoing and other objects, aspects and advantages will be better understood from the following detailed description of preferred embodiments of the invention with reference to the drawings, in which:

FIG. 7 is a view for illustrating the packing part 400 depicted in FIG. 1; and

DESCRIPTION OF THE PREFERRED EMBODIMENT

Preferred embodiments of the present invention will be illustrated below with reference to the accompanying drawings.

A variable-length coding method and apparatus thereof according to the present invention are based on a canonical Huffman code tree. A Huffman code tree having n symbols is composed of (2n−1) nodes. That is, the (2n−1) nodes include n terminal nodes having symbols and (n−1) connecting nodes not having symbols. A canonical Huffman code tree has a structure in which all terminal nodes are positioned to the left of all connecting nodes in each level. It has been known that all Huffman code trees can be translated into canonical Huffman code trees without increasing the average code length.

Figure 8:
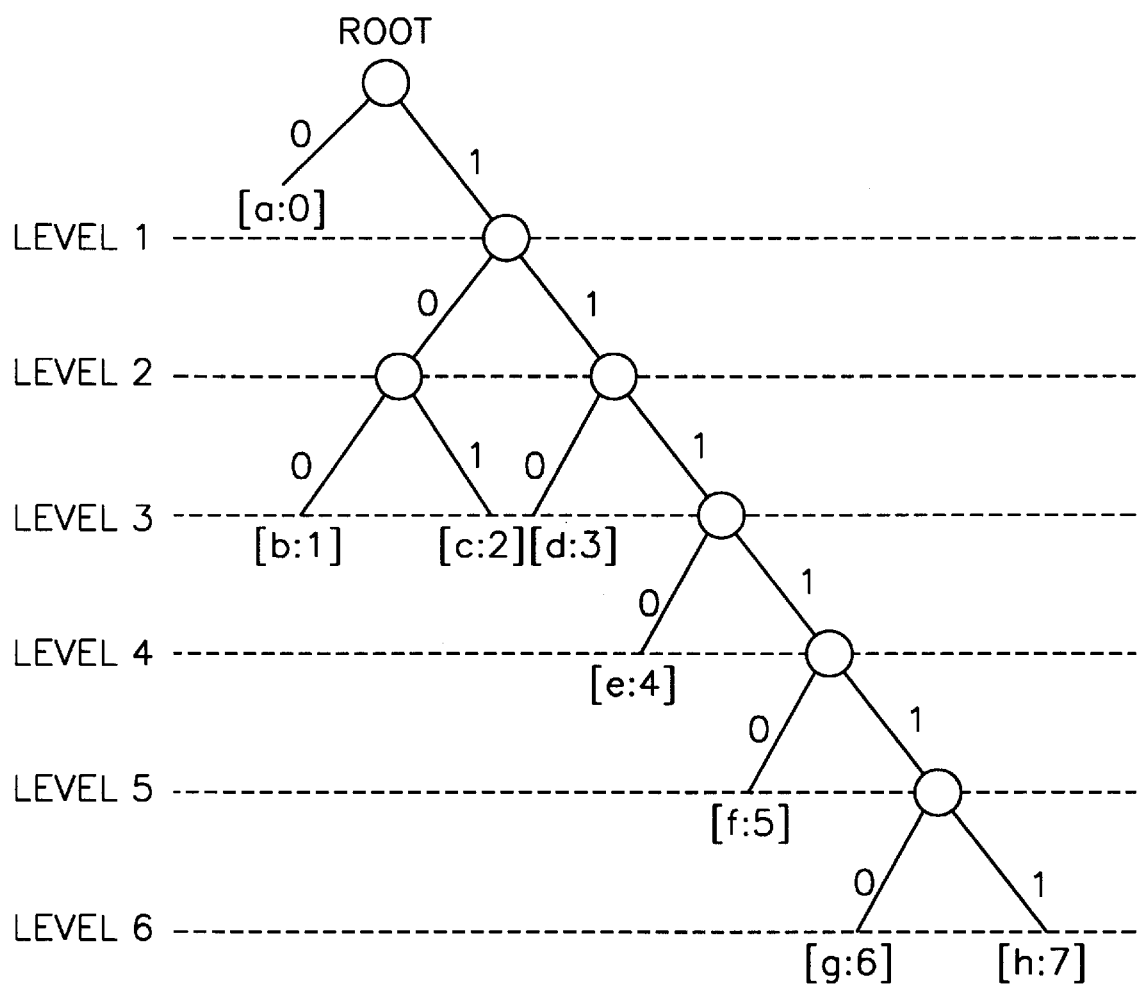
FIG. 8 is a view for showing a structure of a canonical Huffman code tree.

FIG. 8 shows a structure of a canonical Huffman code tree for [a, b, c, d, e, f, g, h]. 8 symbols are positioned to the left of all connecting nodes. Each symbol has a coding bit string from the root to a terminal node thereof as its code word. For instance, a symbol [c] has 3 bits code word [101] and a symbol [f] has 5 bits cod word [11110]. That is, each symbol has a variable-length code word which is defined in a Huffman code tree according to an occurrence probability thereof.

Figure 1:
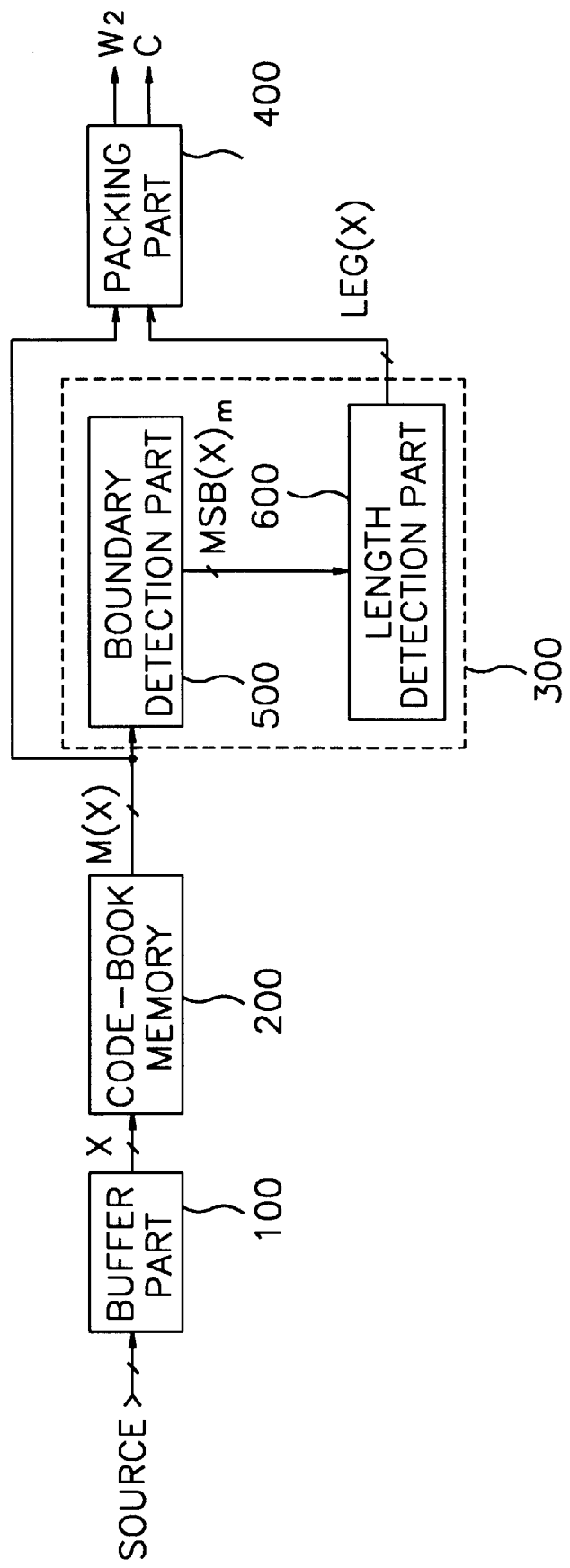
FIG. 1 is a circuit diagram for showing a variable-length coding apparatus according to one embodiment of the present invention.

FIG. 1 is a circuit diagram for showing a variable-length coding apparatus according to one embodiment of the present invention.

Referring to FIG. 1, a variable-length coding apparatus includes a buffer part 100, a code-book memory 200, a variable length detection part 300, and a packing part 400.

The buffer part 100 temporarily stores symbols inputted with a serial or parallel manner from an exterior, and outputs the symbols to the code book memory 200 in response to a control signed (not shown in FIG. 1).

The code-book memory 200 stores variable-length code words with a maximum length of the variable-length code words according to the symbols or addresses corresponding to the symbols. Therefore, when a symbol [X] to which a variable-length code word VLW(X) having a length less than the maximum length thereof is assigned is inputted to the code-book memory 200 through the buffer part 100, the code-book memory 200 generated a memorized code word M(X) including the variable-length code word VLW(X) thereof and stuffing bits, and provides the memorized code word M(X) to the variable-length detection part 300 and the packing part 400, respectively.

For example, when the maximum length of variable-length code words is K bits (K is of integer 1 or more) and a symbol [X] is inputted to the code-book memory 200, the code-book memory 200 generates the memorized code word M(X) of an K-bit string, and outputs the memorized code word M(X) to the variable-length detection part 300 and the packing part 400, respectively.

The variable-length detection part 300 detects a length of a variable-length code word VLW(X) in the memorized code word M(X) which is provided from the code-book memory 200 on the basis of the canonical Huffman code tree, as depicted in FIG. 8.

The variable-length detection part 300 first detects a number of terminal nodes in each level of the Huffman code tree in order to detect the length of the variable-length code word VLW(X). And then, the variable-length detection part 300 operates with a computation manner, illustrated hereinafter, based on the number of terminal nodes in each level and the memorized code word M(X), thereby generating a length value LEG(X) corresponding to the length of the variable-length code words VLW(X). And, the variable-length detection part 300 provides the length value LEG(X) to the packing part 400.

Preferably, the variable-length detection part 300 includes a boundary detection part 500 and a length detection part 600 in order to generate the length value LEG(X), as shown in FIG. 1.

The boundary detection part 500 selects 1-bit to K-bit among bits of the memorized code word M(X) in turn, thereby respectively generating X selected code words $BW(X)_{m=1}, BW(X)_{m=2}, \ldots, BW(X)_{m=K}$. Also, the boundary detection part 500 detects a number of terminal nodes in a level corresponding to each of the selected code words $BW(X)_{m=1, 2, \ldots, K}$. And then, the boundary detection part 500 compares the selected code words $BW(X)_{m=1}, BW(X)_{m=2}, \ldots, BW(X)_{m=K}$ and the numbers of the terminal nodes of levels to each other to thereby detect a boundary between bits of the variable-length code word VLW(X) and stuffing bits in the memorized code word M(X), and generates a boundary value $MSB(X)_m$ as a boundary detection result.

The length detection part 600 generates the length value LEG(X) of the variable-length code word VLW(W) on the basis of the boundary value $MSB(X)_m$ from the boundary detection part 500, and provides the length value LEG(X) to the packing part 400.

Figure 2:
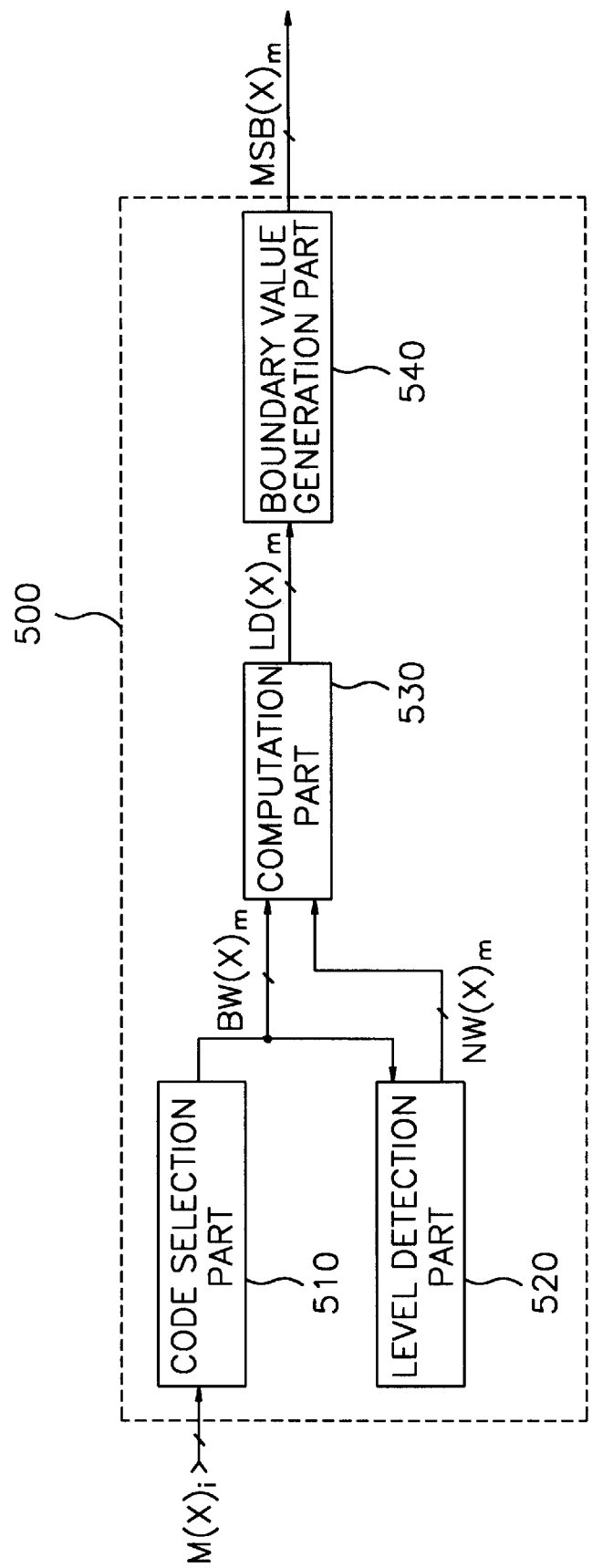
FIG. 2 is a circuit diagram for showing one example of the boundary detection part 500 depicted in FIG. 1 according to the present invention.

FIG. 2 is a circuit diagram for showing one example of the boundary detection part 500 depicted in FIG. 1 according to the present invention.

Referring to FIG. 2, in order to generate the boundary value $MSB(X)_m$, the boundary detection part 500 includes a code selection part 510, a level detection part 520, an 530, and a boundary value generation part 540.

The code selection part 510 selects 1-bit to K-bit among the bits of the memorized code word M(X) which is provided from the code-book memory 200 to thereby in turn generate the selected code words $BW(X)_1, BW(X)_2, \ldots, BW(X)_K$, and provides the selected code words $BW(X)_1, BW(X)_2, \ldots, BW(X)_K$ to the level detection part 520 and the computation part 530, respectively.

When a selected code word $BW(X)_m$ is inputted from the code selection part 510 to the level detection part 520, the level detection part 520 detects level m of the selected code word BW(X)$_m$ in the Huffman code tree, which is defined by a position of the selected code word BW(X)$_m$ in the Huffman code tree, and a total number of terminal nodes from the root to the level m. And then, the level detection part 520 generates a level code word NW(X)$_m$ corresponding to the level m and the total number of terminal nodes to the level m. In order to generate the level code word NW(X)$_m$, the level detection part 520 gives weights to the numbers of terminal nodes in each level according to each level, and sums up the weighted numbers of terminal nodes of each level.

That is, the sum WS(X)$_m$ of the weighted numbers with respect to level m which is defined by the selected code word BW(X)$_m$ is of the following form:

$$W(S(X))_m = \sum_{j=0}^{m-1} 2^{m-j} \cdot L_{j_{10}}$$

where j denotes a level in the Huffman code tree, and L$_j$ is a number of terminal nodes in level j.

The level detection part 520 translates the sum WS(X)$_m$ into a binary digit to generate the level code word NW(X)$_m$ and provides the level code word NW(X)$_m$ to the computation part 530.

The computation part 530 subtracts the level code words NW(X)$_1$, NW(X)$_2$, ※, NW(X)$_K$ from the selected code words BW(X)$_1$, BW(X)$_2$, ※, BW(X)$_K$ in order to generate subtraction result values LD(X)$_1$, LD(X)$_2$, ※, LD(X)$_K$, each of which denotes whether which the selected code words BW(X)$_{m=1, 2, \ldots, K}$ are only composed of bits of the variable-length code word VLW(X) or not.

Figure 3:
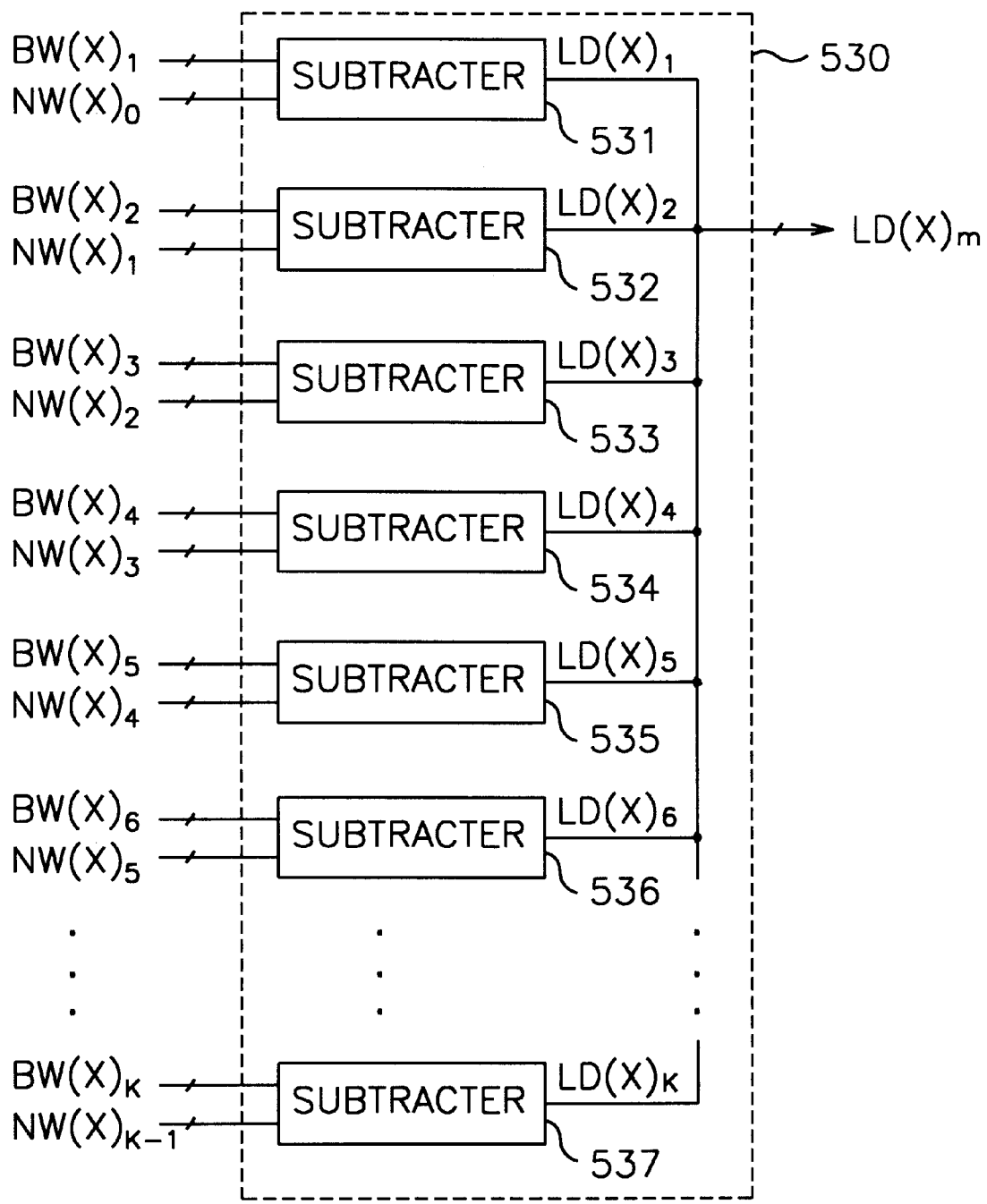
FIG. 3 is a circuit diagram for showing one example of the computation part 530 depicted in FIG. 2 according to the present invention.

FIG. 3 is a circuit diagram for showing one example of the computation part 530 according to the present invention.

Referring to FIG. 3, since the maximum length of the variable-length code word is K bits, the computation part 530 preferably includes K subtracters 531 through 537.

A m-th subtracter of the computation part 530 subtracts the level code word NW(X)$_m$ of level m from the selected code word BW(X)$_m$ of m-bits to generate an subtraction result value LD(X)$_m$ which is one of the subtraction result values LD(X)$_{m=1, 2, \ldots, K}$. And then, the computation part 530 provides the subtraction result values LD(X)$_{m=1, 2, \ldots, K}$ to the boundary value generation part 540.

The boundary value generation part 540 detects most significant bits MSB(X)$_{m=1, 2, \ldots, K}$ from each bit strings of the subtraction result values LD(X)$_{m=1, 2, \ldots, K}$ and outputs the detected most significant bits MSB(X)$_{m=1, 2, \ldots, K}$, to the length detection part 600 as the boundary value MSB(X)$_m$ which denotes the boundary between bits of the variable-length code word VLW(X) and stufing bits in the memorized code word M(X).

Referring to FIG. 1 again, the length detection part 600 generates the length value LEG(X) on the basis of the boundary value MSB(X)$_m$ which denotes the length of the variable-length code word VLW(X) in the memorized code word M(X).

Figure 4:
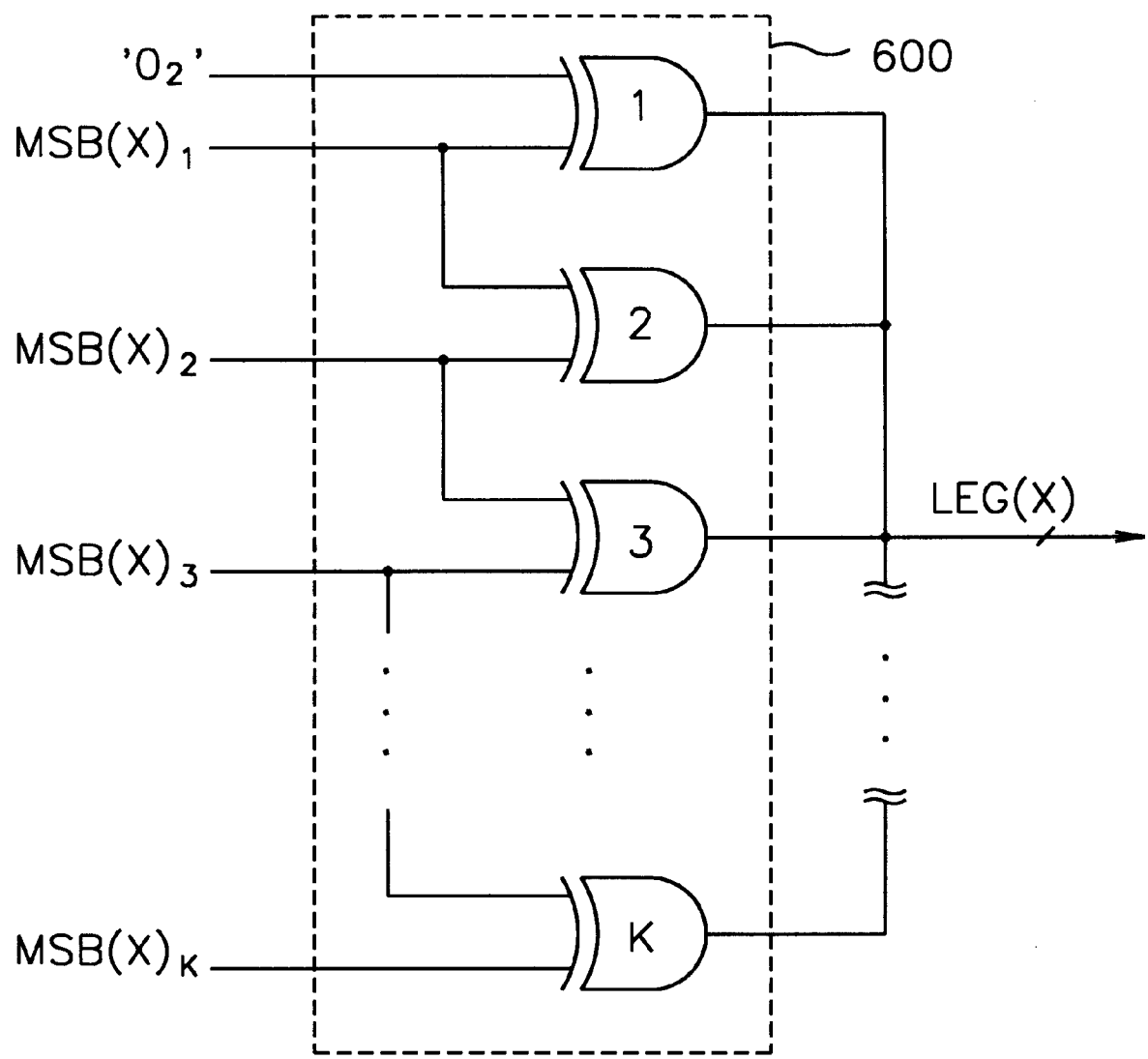
FIG. 4 is a circuit diagram for showing one example of the length detection part 600 depicted in FIG. 1 according to the present invention.

FIG. 4 is a circuit diagram for showing one example of the length detection part 600 according to the present invention.

Referring to FIG. 4, the length detection part 600 includes K XOR gates to generate the length value LEG(X).

A first XOR gate XORs the bit value 0 and MSB(X)$_1$, and the n-th XOR gate XORs MSB(X)$_{n-1}$ and MSB(X)$_n$, where n is of integer 2 through K.

And, logic values generated by each of the K XOR gates are outputted to the packing part 400 as the length value LEG(X) of the variable-length code word VLW(X) included in the memorized code word M(X).

In FIG. 1, the packing part 400 selectively outputs the memorized code word M(X) according to the length value LEG(X), such that the packing part 400 only outputs the variable-length code word VLW(X) except for the stuffing bits.

Figure 5:
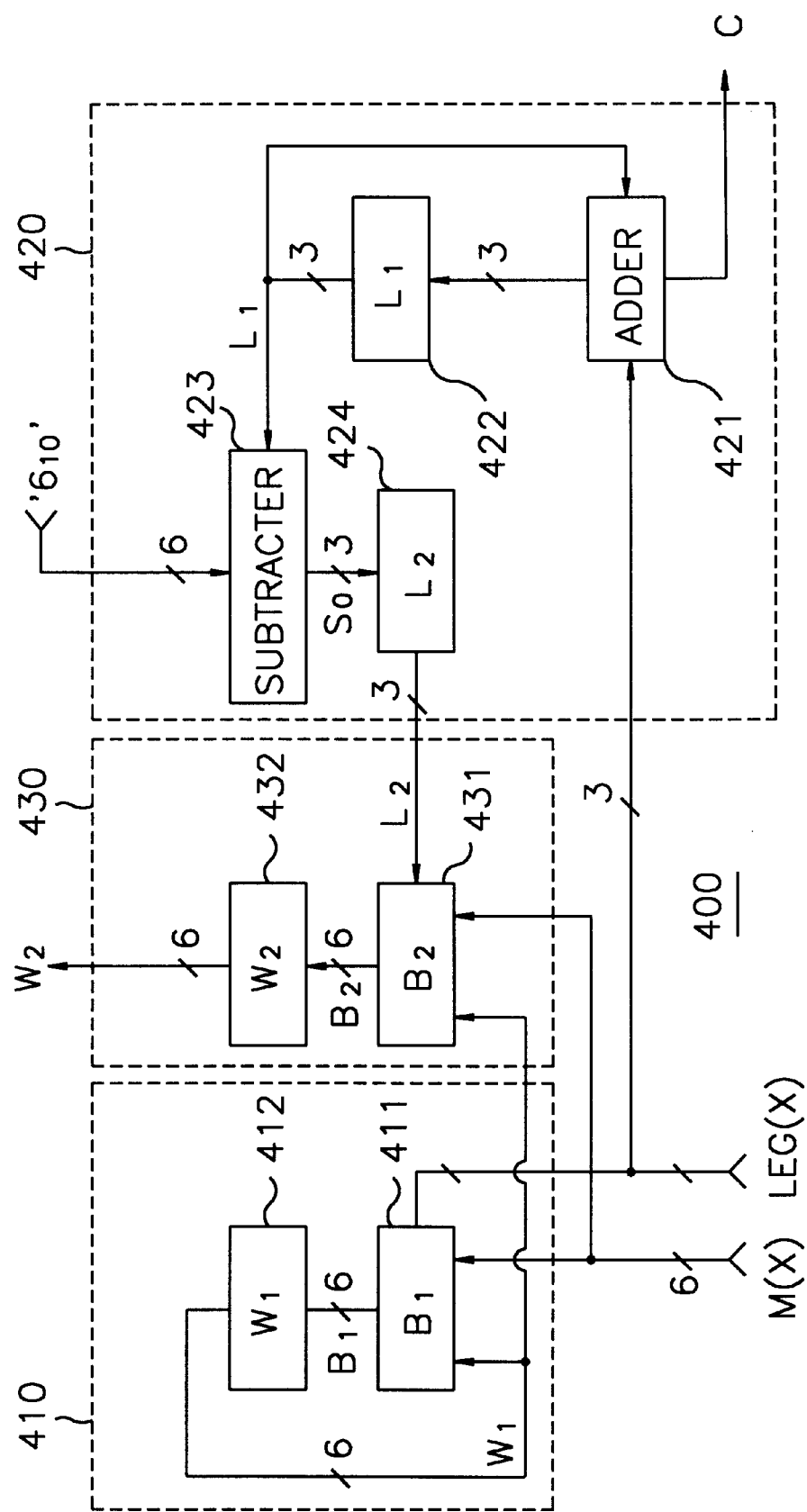
FIG. 5 is a circuit diagram for showing one example of the packing part 400 according to the present invention.

FIG. 5 is a circuit diagram for showing one example of the packing part 400 according to the present invention.

Referring to FIG. 5, the packing part 400 includes an input part 410, an accumulation part 420, and an output part 430.

The input part 410 includes a first barrel shifter 411 and a first latch 412.

The first barrel shifter 411 slides on a 2K-bit string which are inputted from the first latch 412 ad the code-book memory 200, according to the length value LEG(X) to thereby generate a first window bit string B$_1$ of K-bit, and outputs the first window bit string B$_1$ to the first latch 412 in parallel.

The first latch 412 stores the first window bit string B$_1$ and outputs the first latch bit string W$_1$ having the same bit values as those of the first window bit string B$_1$ to the first barrel shifter 411 and the output part 430, respectively. Therefore, as illustrated above, the first latch bit string W$_1$ of K-bit and the memorized code word M(X) of K-bit are inputted to the first barrel shifter 411 in parallel.

The accumulation part 420 includes an adder 421, a second latch 422, a subtracter 423, and a third latch 424.

The adder 421 adds the length value LEG(X) of the variable-length code word VLW(X) to a latched value L$_1$ from the second latch 422 with a modulo-K, and provides an added value to the second latch 422. Further, the adder 421 generates a carry signal when the added value is greater than K. The carry signal is outputted to an exterior for informing a state that bits of the variable-length code word VLW(X) are only stored in a fourth latch 432 of the output part 430, as illustrated in detail below.

The second latch 422 stores the added value from an adder, and outputs the added value to the subtracter 423 and the adder 421, respectively.

The subtracter 423 subtracts the added value from K to thereby generate a subtracted value B$_0$. And, the subtracter 423 provides the subtracted value S$_0$ to the third latch 424.

Then, the third latch 424 outputs the subtracted value S$_0$ as a control signal L$_2$ to the output part 430.

The output part 430 includes a second barrel shifter 431 and the fourth latch 432.

The second barrel shifter 431 slides on a 2K-bit string composed of the first latch bit string W$_1$ from the first latch 412 of the input part 410 and the bit string of the memorized code word M(X) in response to the control signal L$_2$, to thereby generate a second window bit string of K bits.

And, a fourth latch 431 stores the second window bit string B$_2$ with an input order of the second window bit string B$_2$, The fourth latch 431 preferably has the same memory space as the maximum length K of the variable-length code word.

Operations of the variable-length coding method and apparatus thereof according to the present invention will be described below in detail.

When all possible symbols occurring in a data source are [a, b, c, d, e, f, g, h] and frequently occurring numbers of each symbols are in turn 15$_{10}$, 13$_{10}$, 12$_{10}$, 11$_{10}$, 5$_{10}$, 2$_{10}$, 1$_{10}$, 1$_{10}$, each variable-length code word VLW(X) is assigned to the 8 symbols according to the occurrence frequent number of them, as shown in FIG. 8. Table 1 shows code values of the variable-length code words assigned to the 8 symbols according to the canonical Huffman code tree. Variable-length code word of 1-bit is assigned to the most frequently occurring symbol [a], and variable-length code words of 6-bit are assigned to the least frequently occurring symbols [g and h].

TABLE 1

| Symbol [X] | Variable-length code word VLW (X) | | | | | |
|---|---|---|---|---|---|---|
| a | 0 | | | | | |
| b | 1 | 0 | 0 | | | |
| c | 1 | 0 | 1 | | | |
| d | 1 | 1 | 0 | | | |
| e | 1 | 1 | 1 | 0 | | |
| f | 1 | 1 | 1 | 1 | 0 | |
| g | 1 | 1 | 1 | 1 | 1 | 0 |
| h | 1 | 1 | 1 | 1 | 1 | 1 |

The variable-length code words VLW(X) are stored to the code book memory 200 according to the symbols used as addresses thereof, as shown in Table 2 below. When a variable-length code word VLW(X) is stored to the code-book memory 200, a MSB of the variable-length code word VLW(X) is first and lastly, a LSB thereof is stored at one memory unit of memory.

Therefore, since variable-length code words are stored with 6 bits which is the longest length of the variable-length code words, the code-book memory 200 outputs the memorized code-words M(X) of 6-bit when a symbol X is inputted.

TABLE 2

| Symbol [X] | Memorized code word M (X): MSB-LSB | | | | | |
|---|---|---|---|---|---|---|
| a | 0 | x | x | x | x | x |
| b | 1 | 0 | 0 | x | x | x |
| c | 1 | 0 | 1 | x | x | x |
| d | 1 | 1 | 0 | x | x | x |
| e | 1 | 1 | 1 | 0 | x | x |
| f | 1 | 1 | 1 | 1 | 0 | x |
| g | 1 | 1 | 1 | 1 | 1 | 0 |
| h | 1 | 1 | 1 | 1 | 1 | 1 | x: stuffing bit (or don't care)

Figure 6:
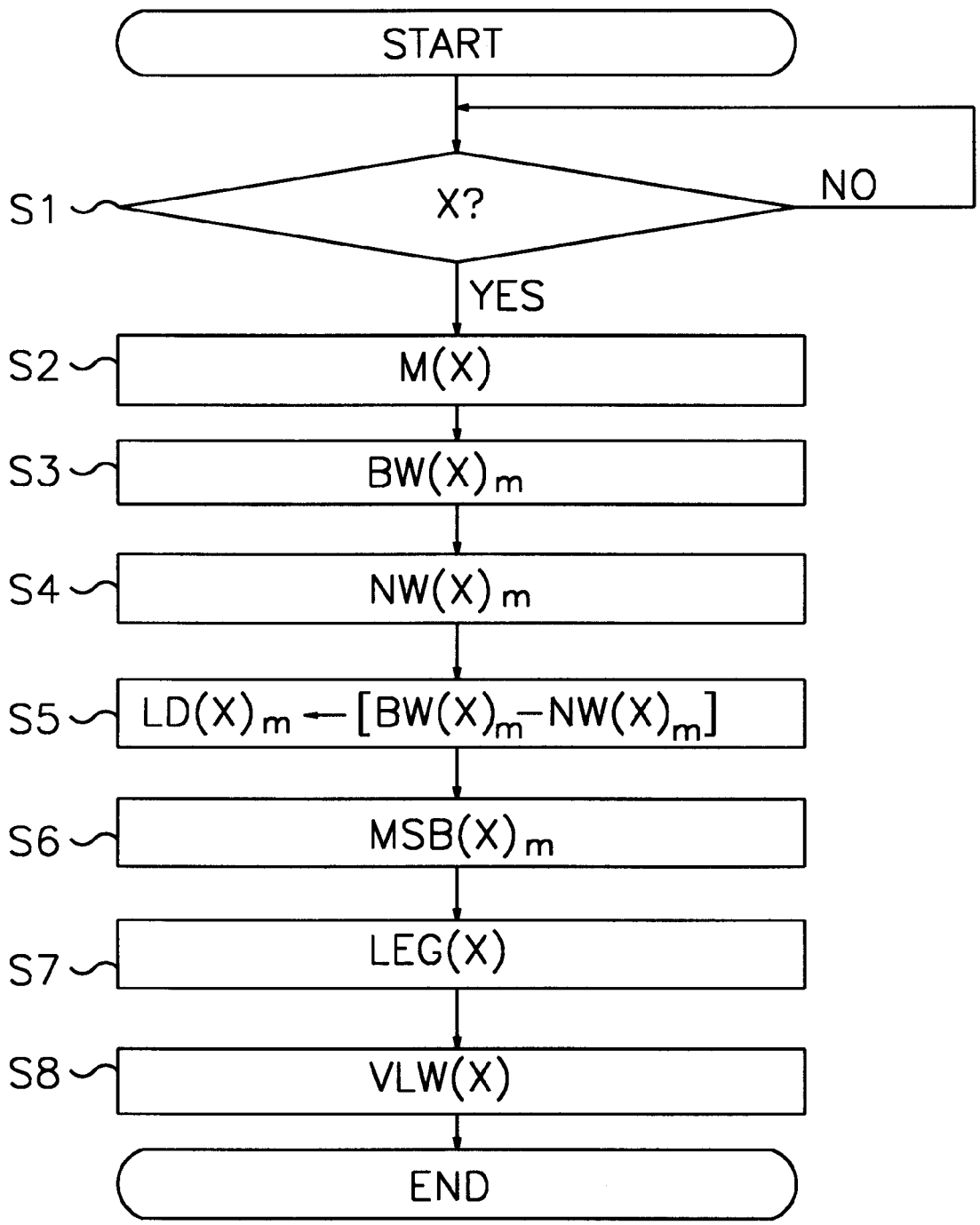
FIG. 6 is a flowchart for illustrating the variable-length coding apparatus depicted in FIG. 1.

FIG. 6 is a flowchart for illustrating the variable-length coding apparatus depicted in FIG. 1.

Referring to FIG. 6, in step 1, when the symbol [c] is inputted to the code-book memory 200 from the buffer part 100, the code-book memory 200 generates the memory code word M(c) having the bit string [101xxx] corresponding to the symbol [c], as shown in table 2. And then, the code book memory 200 provides the memory code word M(c) to the variable-length detection part 300 and the packing part 400, respectively (ST1 and ST2).

The memorized code word M(c) which is inputted to the variable-length detection part 300 is inputted to the code selection part 510 of the boundary detection part 500, as shown in FIG. 2. When the memorized code word M(c) is inputted to the code selection part 510, the code selection part 510 selects 1-bit to 6-bit among the memorized code word M(c) in turn to thereby generate selected code words $BW(c)_{m\ 1,\ 2,\ \ldots,\ 6}$, as shown in table 3. And then, the code selection part 510 provides each selected code word BW(c) $_{m-1,\ 2,\ \ldots,\ 6}$ to the level detection part 510 and computation part 520, respectively (ST3).

TABLE 3

| selected code word $BW\ (c)_m$ | | | | | | | |
|---|---|---|---|---|---|---|---|
| $BW\ (c)_{m-1}$ | = | 1 | | | | | |
| $BW\ (c)_{m-2}$ | = | 1 | 0 | | | | |
| $BW\ (c)_{m-3}$ | = | 1 | 0 | 1 | | | |
| $BW\ (c)_{m-4}$ | = | 1 | 0 | 1 | 1 | | |
| $BW\ (c)_{m-5}$ | = | 1 | 0 | 1 | 1 | 1 | |
| $BW\ (c)_{m-6}$ | = | 1 | 0 | 1 | 1 | 1 | 1 |

When the selected code word BW(c)m, which is generated by selecting m-bit among the memorized code word M(c), is inputted to the level detection part 520, the level detection prat 520 detects the number of terminal nodes from level 1 to level m on the basis of the canonical Huffman code tree depicted in FIG. 8 and generates the level code word $NW(c)_m$ weighed by each level, as illustrated above (ST4).

For example, when m=3, the code selection part 510 generates the selected code word $BW(c)_3$=[101], as shown in table 3. Then, level detection part 520 gives weights to each level and sums up the weighed numbers of terminal nodes, thereby generating the sum $WS(c)_3$ as follows:

$$W(S(c))_3 = \sum_{j=0}^{2} 2^{3-j} \cdot L_j = 8$$

where j denotes a level in the canonical Huffman code tree, and $L_j$ denotes the number of terminal nodes in level j.

And then, the level detection part translates the sum $WS(c)_3$ into the binary digit to thereby generate the level code word $NW(c)_3$=[0001000]. Level code words $NW(c)_m$ (m–1, 2, . . . , 6) with respect to all selected code word $BW(c)_m$ (m=1, 2, . . . , 6) are shown in table 4 below.

TABLE 4

| m | | | NW (c) | | | | | | |
|---|---|---|---|---|---|---|---|---|---|
| 1 | 0 | = | 0 | 0 | 0 | 0 | 0 | 0 | 0 |
| 2 | 2 | = | 0 | 0 | 0 | 0 | 1 | 0 | |
| 3 | 8 | = | 0 | 0 | 1 | 0 | 0 | 0 | |
| 4 | 14 | = | 0 | 0 | 1 | 1 | 1 | 0 | |
| 5 | 30 | = | 0 | 1 | 1 | 1 | 1 | 0 | |
| 6 | 62 | = | 1 | 1 | 1 | 1 | 1 | 0 | |

When the level code words $NW(c)_m$ (m–1, 2, . . . , 6) and the selected code word $BW(c)_m$ (m=1, 2, . . . , 6) are respectively inputted to the computation part 530, the level code words $NW(c)_n$ (m=1, 2, . . . , 6) and the selected code words $BW(c)_m$ (m=1, 2, . . . , 6) which are respectively inputted to the computation part 530 are respectively and in turn inputted to the first through sixth subtracter 531 through 536 of the computation part 530, as shown in FIG. 3.

Each of the first through sixth subtracter 531 through 536 performs the same function $LD(c)_m$ as follows:

$$LD(o)_m = BW(c)_m - NW(c)_m$$

Therefore, the computation part 530 generates the first through sixth subtraction result $LD(c)_{m=1,2,\ldots,6}$ as the operation result values $LD(X=c)_m$=1,2, . . . , 6 with respect to the symbol c, as shown in table 5 below.

TABLE 5

| m | LD (C)$_m$ MSB-LSB | | | | | |
|---|---|---|---|---|---|---|
| 1 | 0 | 0 | 0 | 0 | 0 | 1 |
| 2 | 0 | 0 | 0 | 0 | 0 | 0 |
| 3 | 0 | 0 | 0 | 0 | 0 | 1 |
| 4 | 1 | 1 | 1 | 1 | 0 | 1 |
| 5 | 1 | 1 | 1 | 0 | 0 | 1 |
| 6 | 1 | 1 | 0 | 0 | 0 | 1 |

And, the first through sixth subtraction result $LD(c)_{m=1,2,\ldots,6}$ are provided to the boundary value generation part 540 (ST5).

Illustrating the step 5 in detail, the first through sixth subtracter 531 through 536 generate the first through sixth subtraction result $LD(c)_{m=1,2,\ldots,6}$ according to the function $LD(c)_m$, as follows:

$$LD(c)_1 = \sum_{i=1}^{1} 2^{1-i} \cdot b_i - \sum_{j=0}^{0} 2^{1-j} \cdot L_j = 1_{10}$$

$$LD(c)_2 = \sum_{i=1}^{2} 2^{2-i} \cdot b_i - \sum_{j=0}^{1} 2^{2-j} \cdot L_j = 0_{10}$$

$$LD(c)_3 = \sum_{i=1}^{3} 2^{3-i} \cdot b_i - \sum_{j=0}^{2} 2^{3-j} \cdot L_j = 1_{10}$$

$$LD(c)_5 = \sum_{i=1}^{5} 2^{5-i} \cdot b_i - \sum_{j=0}^{4} 2^{5-j} \cdot L_j = -7_{10}$$

$$LD(c)_4 = \sum_{i=1}^{4} 2^{4-i} \cdot b_i - \sum_{j=0}^{3} 2^{4-j} \cdot L_j = -3_{10}$$

$$LD(c)_6 = \sum_{i=1}^{6} 2^{6-i} \cdot b_i - \sum_{j=0}^{5} 2^{6-j} \cdot L_j = -15_{10}$$

where $b_i$ denotes the i-th bit value of the selected code word $BW(c)_m$, and $L_j$ denotes the number of terminal nodes in level j.

In step 6, the boundary value generation part 540 detects the bit values of $MSB(c)_{m=1,2\ldots,6}$, from each bit string of the subtraction results $LD(c)_{m=1,2,\ldots,6}$, and outputs the bit values of $MSB(c)_{m=1,2,\ldots,6}$ as the boundary value $MSB(c)_{m=1,2,\ldots,6}$ to the length detection part 600 (ST6).

In step 7, as shown in FIG. 4, each bit of the $MSB(c)_{m=1,2\ldots,6}$=[000111] which is inputted to the length detection part 600 is inputted to the first through sixth XOR gate in parallel, such that the length detection part 600 generates a bit string [000100] as the length value LEG(c) which denotes the length of the variable length code word VLW(c) of the symbol [c]. And, the bit string [000100] is provided to the packing part 400 (ST7).

In step 8, when the length value LBG(c) is inputted to the packing part 400, the packing part 400 detects the variable-length code word VLW(c) among the memorized code word M(c) in response to the length value LEG(c) and only outputs variable length code word VLW(c) to thereby encode the symbol [c] (ST8).

Operations of the packing part 400 according to the present invention will be described below in detail with reference to FIGS. 5 and 7.

FIG. 7 is a view for showing the outputs of each part of the packing part 400 when symbols [a, b, c, f, d, h, e, g, a, b] are inputted to the buffer part 100 in turn.

Referring to FIG. 7, in time t−1, since a memorized code word M(X) is not inputted from the code-book memory 200 to the packing part 400, the first barrel shifter 411 of the packing part 400 provides a bit string [x, x, x, x, x, x] as the first window bit string $B(t-1)_1$ to the first latch 412 in response to the length value LEG(c)=0.

Therefore, the second latch 422 outputs $L_1$=0 to the subtracter 423 and the adder 421, respectively, such that the third latch 424 provides $L_2$−6 as the control signal to the second barrel shifter 431. And, the second barrel shifter 431 outputs $B(t=1)_2$=[x, x, x, x, x, x] as the second window bit string $B(t=1)_2$ composed of bits from LSB to the sixth bit of the 2K bits, as shown in FIG. 7.

In time t=2, when the symbol [a] is inputted to the code-book memory 200 and the memorized code word M(a) for the symbol [a] is generated from the code-book memory 200, the memorized code word M(a)=[$a_1$, x, x, x, x, x] is inputted to the first barrel shifter 411 of the input part 410 and the second barrel shifter 431 of the output part 430, respectively. At the same time, the length value LEG(a)=1 corresponding to the symbol [a] is generated from the variable-length detection part 300, as illustrated above, and the length value LEG(a)=1 is provide to the first barrel shifter 411 and the adder 421, respectively.

When the length value LEG(a)=1 from the variable-length detection part 300 and the memorized code word M(a) from the code-book memory 200 are respectively inputted to the first barrel shifter 411, the barrel shifter 411 slides on the first latch bit string [x, x, x, x, x, x] from the first latch 412 and the bit string M(a)=[$a_1$, x, x, x, x, x] of the memorized code word M(a) in response to the length value LEG(a)=1, so that the first barrel shifter 411 generates the first window bit string $W_1$=[x, x, x, x, x, $a_1$], as shown in FIG. 7, and outputs the first window bit string $W_1$=[x, x, x, x, x, $a_1$] to the first latch 412. The first latch 412 outputs the first window bit string $W_1$=[x, x, x, x, x, $a_1$] as the first latched bit string $L_1$ to the first barrel shifter 411 and the second barrel shifter 431, respectively.

However, in this time, since the control signal $L_2$=0 which provided from the third latch 424 of the accumulation part 420 is inputted to the second barrel shifter 431, the second barrel shifter 431 outputs a bit string [$a_1$, x, x, x, x, x] to the fourth latch 432.

In time t−3, the memorized code word M(b)−[$b_1$, $b_2$, $b_3$, x, x, x] of the symbol [b] and the length value LEG(b)=3 are inputted to the first barrel shifter 411. The first barrel shifter 411 slides on a bit string [x, x, x, x, x, $a_1$, $b_1$, $b_2$, $b_3$, x, x, x] formed by the memorized code word M(b)=[$b_1$, $b_2$, $b_3$, x, x, x] and the first latched bit string $W_1$=[x, x, x, x, x, $a_1$] in response to the length value LEG(b)=3, and accesses 6 bits after 3 bits from MSB of the bit string to thereby output the accessed 6 bits [x, x, $a_1$, $b_1$, $b_2$, $b_3$] as the first window bit string $B(t=3)_1$ to the first latch 412. Then, the first latch 412 outputs the first window bit string $B(t=3)_1$=[X, x, $a_1$, $b_1$, $b_2$, $b_3$] as the first latched bit string $W_1$ to the first barrel shifter 411 ad the second barrel shifter 421, respectively. On the other hand, the adder 421 adds the LEG(b)=3 to the $L_1$=1 from the second latch 422, and the outputs the added value [4] to the second latch 422. The second latch 422 outputs the previous added value $L_1$=1 to the subtracter 423 and at the same time, stores the current added value $L_1$=4 there instead of the previous added value $L_1$=1.

The subtracter 423 subtracts the previous added value $L_1$=j from the value [6], and provides the subtracted value $S_0$=5 to the third latch 424. Then, the third latch 424 stores the subtracted value $S_0$=5 and outputs the subtracted value $S_0$=5 as the control signal $L_2$=5 to the second barrel shifter 431.

The second barrel shifter 431 slides on a bit string [x, x, x, x, x, $a_1$, $b_1$, $b_2$, $b_3$, x, x, x] formed by the memorized code word M(b)=[$b_1$, $b_2$, $b_3$, x, x, x] and the first latched bit string $W_1$=[x, x, x, x, x, $a_1$] in response to the control signal $L_2$=5 which is provided from the third latch 424, and accesses 6 bits [$a_1$, $b_1$, $b_2$, $b_3$, x, x] after 5 bits from MSB of the bit string. And then, the second barrel shifter 431 outputs the accessed 6 bits as the second window bit string B(t=3)$_2$=[$a_1$, $b_1$, $b_2$, $b_3$, x, x] to the fourth latch 432.

The fourth latch 432 stores the second window bit string B(t=3)$_2$=[$a_1$, $b_1$, $b_2$, $b_3$, x, x].

In time t=4, the memorized code word M(c)=[$c_1$, $c_2$, $c_3$, x, x, x] of the symbol [c] and the length value LEG(c)=3 are inputted to the first barrel shifter 411. The first barrel shifter 411 slides on a bit string [x, x, $a_1$, $b_1$, $b_2$, $b_3$, $c_1$, $c_2$, $c_3$, x, x, x] formed by the memorized code word M(b)=[$c_1$, $c_2$, $c_3$, x, x, x] and the first latched bit string $W_1$=[x, x, $a_1$, $b_1$, $b_2$, $b_3$, $c_1$] in response to the length value LEG(c)=3, and accesses 6 bits after 3 bits from MSB of the bit string to thereby output the accessed 6 bits [$b_1$, $b_2$, $b_3$, $c_1$, $c_2$, $c_3$] as the first window bit string B(t=4)$_1$ to the first latch 412. Then, the first latch 412 outputs the first window bit string B(t=4)$_1$= [$b_1$, $b_2$, $b_3$, $c_1$, $c_2$, $c_3$] as the first latched bit string $W_1$ to the first barrel shifter 411 and the second barrel shifter 421, respectively.

On the other hand, the adder 421 adds the LEG(c)=3 to the $L_1$=4 from the second latch 422 to thereby generate an added value [7]. But, since the adder 421 performs with 6-module addition, the adder 421 outputs the added value [1] and the carry signal C=1. And, the adder 421 provides the added value [1] to the second latch 422, and outputs the carry signal C=1 to the exterior.

The second latch 422 outputs the previous added value $L_1$=4 to the subtracter 423 and at the same time, replaces the previous added value $L_1$=4 as the current added value $L_1$=1, as shown in FIG. 7.

The subtracter 423 subtracts the previous added value $L_1$=4 from the value [6], and provides the subtracted value $S_0$=2 to the third latch 424. Then, the third latch 424 stores the subtracted value $S_0$=2 and outputs the subtracted value $S_0$=2 as the control signal $L_2$=2 to the second barrel shifter 431.

And then, the second barrel shifter 431 slides on a bit string [x, x, $a_1$, $b_1$, $b_2$, $b_3$, $c_1$, $c_2$, $c_3$, x, x, x] formed by the memorized code word M(b)=[$c_1$, $c_2$, $c_3$, x, x, x] and the first latched bit string $W_1$=[x, x, $a_1$, $b_1$, $b_2$, $b_3$] in response to the control signal $L_2$=2 which is provided from the third latch 424, and accesses 6 bit [$a_1$, $b_1$, $b_2$, $b_3$, $c_1$, $c_2$] after 2 bits from MSB of the bit string. And, the second barrel shifter 431 outputs the accessed 6 bits as the second window bit string B(t=4)$_2$=[$a_1$, $b_1$, $b_2$, $b_3$, $c_1$, $c_2$] to the fourth latch 432.

In this time, all the 6 bits storage space of the fourth latch 432 are occupied by bits of the variable-length code words. Therefore, by accessing the bits outputted from the latch 432 in response to the occurrence of the carry signal C=1, we can obtain only bits of the variable-length code words except for the stuffing bits.

As the process illustrated above, the packing part 400 continuously output variable-length code words corresponding to inputted symbols.

Therefore, the present invention can translate the symbols into the variable-length code words without storing the length data in a memory.

While the invention has been described in terms of a preferred single embodiment, those skill in the art will recognize that the invention can be practiced with modification within the spirit and scope of the appended claims.

What is claimed is:

1. A method for translating symbols into variable-length codewords by using a coding apparatus, the code apparatus including a code-book memory for storing the variable-length code words with a maximum length of the variable-length code words according to the symbols, the method comprising the steps of:

a) generating a memorized code word from the code-book memory by inputting a symbol to the code-book memory;

b) detecting a length of a variable-length code word included in the memorized code word on the basis of selected code words, levels defined in Huffman code tree by each of the selected code words, and numbers of terminal nodes in each of the levels, wherein the selected code words are generated by selecting m bit among the memorized code word K times, where m=1, 2, 3, 4, . . . , K, and K denotes a maximum length of the variable length code word; and c) accessing the variable-length code word from the memorized code word according to the length of the variable-length code word.

2. A method as claimed in claim 1, wherein said step h) includes the steps of:

b-1) detecting boundary between the variable-length code word and stuffing bits of the memorized code word on the basis of the selected code words and the number of terminal nodes in each of the levels in order to generate a boundary value; and b-2) detecting the length of the variable-length code word which is included in the memorized code word on the basis of a boundary value by step b 1).

3. A method as claimed in claim 2, wherein said step b-1) includes the steps of:

b-1-1) detecting the levels corresponding to each of the selected code words;

b-1-2) detecting the numbers of terminal nodes in each of the levels;

b-1-3) giving weights to the numbers of terminal nodes in response to the levels, thereby generating weighted numbers for each of the levels;

b-1-4) summing up the weighted numbers from the root of the Huffman code tree to each of the levels, thereby generating sums corresponding to each of the levels;

b-1-5) translating the sums into binary digits, thereby generating level code words corresponding to each of the sums;

b-1-6) subtracting each of the level code words from the selected code words corresponding to each of level code words, thereby generating subtraction result values: and b-1-7) detecting most significant bits from the subtraction result values in order to output the most significant bits as the boundary value.

4. A method as claimed in claim 3, wherein said length of the variable length code word is represented by a length value which is generated by XORing the most significant bits to one another.

5. A method for translating symbols into variable-length code words by using a coding apparatus, the coding apparatus including a code-book memory for storing the variable-length code words with a maximum length of the variable-length code words according to the symbols, the method comprising the steps of:

a) generating a memorized code word from the code-book memory by inputting a symbol to the code-book memory;

b) selecting m bit in the memorized code word in order to generate selected code words, where m=1, 2, 3, 4, ..., K, and K denotes a maximum length of the variable length code words;

c) determining whether each of the selected code words consists of bits of a variable length code word on the basis of each level which is defined in Huffman code tree according to each selected code word, and numbers of terminal nodes in each level; and d) accessing the variable-length code word from the memorized code word according to a result of the step c).

6. A method as claimed in claim 5, wherein said step c) includes the steps of:

c-1) detecting the levels of each of the selected code words on the basis of the Huffman code tree;

c-2) detecting the numbers of terminal nodes in each level; and c-3) operating a function $LD(X)_m$:

$$LD(X)_m = BW(X)_m - NW(X)_m$$
$$BW(X)_m = \sum_{i=1}^{m} 2^{m-i} \cdot b_i$$
$$NW(X)_m = \sum_{j=0}^{m-1} 2^{m-j} \cdot L_j$$

wherein $b_i$ is the i-th bit value of a selected code word which is selected m bits among the memorized code word, and $L_j$ is a total number of terminal nodes in the j-th level of the Huffman code tree; and c-4) determined whether each $LD(X)_m$ is a negative value or not.

7. A method as claimed in claim 6, wherein said step d) accesses a selected code word having the longest length of selected code words having non-negative values as the variable length code word.

8. An apparatus for translating symbols which are represented by fixed-length code words into variable-length code words, the apparatus comprising:

a) code-book memory means for storing variable-length code words with a maxim length of the variable-length code words according to the symbols;

b) variable-length detection means for detecting a length of a variable-length code word included in the memorized code word on the basis of selected code words, levels defined in Huffman code tree by each of the selected code words, and numbers of terminal nodes in each of the levels, wherein the selected code words are generated by selecting m bit among the memorized code word K times, where m=1, 2, 3, 4, ..., K, and K is a maximum length of the variable length code word; and c) packing means for accessing the variable length code word from the memorized code word according to the length of the variable-length code word.

9. An apparatus as claimed in claim 8, wherein said variable-length detection means includes:

boundary detection means for detecting boundary between the variable length code word and stuffing bits of the memorized code word on the basis of the selected code words and the numbers of terminal nodes in each of the levels in order to generate a boundary value; and length detection means for detecting the length of the variable-length code word which is included in the memorized code word on the basis of the boundary value.

10. An apparatus as claimed in claim 9, wherein said boundary detection means includes:

means for detecting the levels corresponding to each of the selected code words;

means for detecting the numbers of terminal nodes in each of the levels;

means for giving weights to the numbers of terminal nodes in response to the levels, thereby generating weighted numbers for each of the levels;

means for summing up the weighted numbers from the root of the Huffman code tree to each of the levels, thereby generating sums corresponding to each of the levels;

means for translating the sums into the binary digits, thereby generating level code words corresponding to each of the sums;

means for subtracting each of the level code words from the selected code words corresponding to each of level code words, thereby generating subtraction result values; and means for detecting most significant bits from the subtraction result values in order to output the most significant bits as the boundary value.

11. An apparatus as claimed in claim 10, wherein said length value is generated by XORing the most significant bits to one another.

12. An apparatus as claimed in claim 8, wherein said packing means includes a input part for selecting bits among a bit string in response to the length of the variable-length code word in order to generate a first window bit string, wherein the bit string consists of a bit string of the memorized code word and the first window bit string;

an output part for detecting bits of the variable-length code word in the first window bit string and the bit string of the memorized code word in response to a control signal and outputting detected bits; and an accumulation part for accumulating a number of the detected bits to thereby generate the control signal.

13. An apparatus as claimed in claim 12, wherein said input part includes a first latch for outputting the first window bit string to the output part and a first barrel shifter; and the first barrel shifter for sliding on the bit string in response to the length of the variable-length code word in order to generate a first window bit string.

14. An apparatus as claimed in claim 12, wherein said output part includes a second barrel shifter for sliding on the first window bit string and the bit string of the memorized code word in response to the control signal in order to detect the bits of the variable length code word; and a second latch for storing the bits of the variable length code word form the second barrel shifter.

15. An apparatus as claimed in claim 12, wherein said accumulation part includes a third latch for storing an added value from an adder;

the adder for adding the length value of the variable-length code word to the added value from the third latch with a modulo-K, thereby generating a carry signal when the added value is K; and a subtracter for subtracting the added value from K to thereby generate the control signal.

16. An apparatus for translating symbols into variable-length code words, the apparatus comprising:
  a) means for generating a memorized code word from the code-book memory by inputting a symbol to the code-book memory;
  b) means for selecting m bit among the memorized code word in order to generate selected code words, where m=1, 2, 3, 4, . . . , K, and K denotes a maximum length of the variable length code word;
  c) means for determining whether each of the selected code words consists of bits of a variable length code word on the basis of each level which is defined in Huffman code tree according to each selected code word, and numbers of terminal nodes in each level; and
  d) means for accessing the variable-length code word from the memorized code word according to a determination result.

17. An apparatus as claimed in claim 16, wherein said determination means includes:
  c-1) means for detecting the levels of each of the selected code words on the basis of the Huffman code tree;
  c-2) means for detecting the numbers of terminal nodes in each level; and
  c-3) means for operating a function $LD(X)_m$:

$$LD(X)_m = BW(X)_m - NW(X)_m$$

$$BW(X)_m = \sum_{i=1}^{m} 2^{m-i} \cdot b_i$$

$$NW(X)_m = \sum_{j=0}^{m-1} 2^{m-j} \cdot L_j$$

wherein $b_i$ is the i-th bit value of a selected code word selected m bits among the memorized code word, and $L_j$ is a total number of terminal nodes in the j-th level of the Huffman code tree; and
  c-4) means for determining whether each $LD(X)_m$ is a negative value or not.

18. An apparatus as claimed in claim 16, wherein said access means accesses a selected code word having the longest length of selected code words having non-negative values as the variable length code word.

19. An apparatus as claimed in claim 16, wherein said access means includes an input part for selecting bits among a bit string in response to the length of the variable-length code word in order to generate a first window bit string, wherein the bit string consists of a bit string of the memorized code word and the first window bit string;
  an output part for detecting bits of the variable-length code word in the first window bit string and the bit string of the memorized code word in response to a control signal and outputting detected bits; and
  an accumulation part for accumulating a number of the detected bits to thereby generate the control signal.

20. An apparatus as claimed in claim 12, wherein said input part includes a first latch for outputting the first window bit string to the output part and a first barrel shifter; and
  the first barrel shifter for sliding on the bit string in response to the length of the variable-length code word in order to generate a first window bit string.

21. An apparatus as claimed in claim 19, wherein said output part includes a second barrel shifter for sliding on the first window bit string and the bit string of the memorized code word in response to the control signal in order to detect the bits of the variable length code word; and
  a second latch for storing the bits of the variable length code word form the second barrel shifter.

22. An apparatus as claimed in claim 19, wherein said accumulation part includes a third latch for storing an added value from an adder;
  the adder for adding the length value of the variable-length code word to the added value from the third latch with a modulo-K, thereby generating a carry signal when the added value is K; and
  a subtracter for subtracting the added value from K to thereby generate the control signal.

* * * * *